United States Patent [19]
Choi et al.

[11] Patent Number: 5,583,815
[45] Date of Patent: Dec. 10, 1996

[54] MODE SETTING CURCUIT AND METHOD OF A SEMICONDUCTOR MEMORY DEVICE

[75] Inventors: Myung-Chan Choi, Suwon; Seong-Ook Jung, Seoul, both of Rep. of Korea

[73] Assignee: Samsung Electronics Co., Ltd., Suwon, Rep. of Korea

[21] Appl. No.: 506,954

[22] Filed: Jul. 26, 1995

[30] Foreign Application Priority Data

Jul. 27, 1994 [KR] Rep. of Korea ............... 18304/1994

[51] Int. Cl.⁶ ............................................... G11C 7/00
[52] U.S. Cl. ............... 365/189.05; 365/193; 365/230.08
[58] Field of Search ................... 365/189.05, 230.08, 365/193

[56] References Cited

U.S. PATENT DOCUMENTS 4,984,216  1/1991  Toda et al. ................. 365/230.08
5,301,164  4/1994  Miyawaki ................. 365/230.08 X Primary Examiner—Son T. Dinh
Attorney, Agent, or Firm—Cushman Darby & Cushman IP Group of Pillsbury Madison & Sutro LLP

[57] ABSTRACT

A mode setting circuit and method of a semiconductor memory device for selectively enabling a specific operation mode out of preset operation modes. The mode setting circuit gates a signal set at an internal node of a row address buffer according to a mode setting control signal. The row address buffer receives a row address signal supplied from the exterior and generates a shaped row address. The latch circuit latches a signal generated from the gating circuit and generates a mode setting signal for enabling the specific operation mode in response to a variation in a specific signal of the internal node.

10 Claims, 7 Drawing Sheets

MODE SETTING CURCUIT AND METHOD OF A SEMICONDUCTOR MEMORY DEVICE

BACKGROUND OF THE INVENTION

The present invention relates to a semiconductor memory device, and more particularly to a mode setting circuit and method of a semiconductor memory device for selectively enabling a specific operation mode out of preset operation modes.

To enable a variety of operation modes using the identical device, a fuse select circuit has been conventionally utilized. That is, a fuse corresponding to a desired specific operation mode is disconnected to activate the specific operation mode. However, in such case, once a device is set to one operation mode, it is impossible to be converted to another operation mode due to the physical characteristic of the fuse select circuit.

To overcome such a disadvantage, a configurable mode setting circuit has proposed. A plurality of operation modes are set within the mode setting circuit and signals received from the exterior are combined, thereby selecting the specific operation mode out of the preset operation modes. The mode setting circuit sets the specific operation mode during an enabled interval of a mode setting control signal after combining a control signal synchronized with a row address strobe signal $\overline{RAS}$ with a row address generated from a row address buffer.

Since the mode setting is implemented under a write enable CAS before RAS (WCBR) condition, it will be readily understood that control signals having information of a column address signal and a write enable signal are needed.

FIGS. 1A and 1B illustrate such conventional mode setting circuits. A mode setting control signal WCBRSET, a row address signal RAi generated from the row address buffer and a constant source voltage signal $\phi$VCCH are supplied to the mode setting circuits of FIGS. 1A and 1B, and a mode setting signal MDSTi is generated therefrom. The constant source voltage signal $\phi$VCCH is maintained at logic "low" during power-down of a source voltage to set a device to an initial mode. After power-up of the source voltage, the constant source voltage $\phi$VCCH is maintained at logic "high".

Referring to FIG. 1A, an inverter 2 receives the mode setting control signal WCBRSET. A PMOS transistor 4 has a source electrode connected to a source voltage VCC, and a gate electrode connected to the output signal of the inverter 2. A PMOS transistor 6 has a gate electrode connected to the row address signal RAi, a source electrode connected to the drain electrode of the PMOS transistor 4, and a drain electrode connected to an output node N1. An NMOS transistor 8 has a gate electrode connected to the row address signal RAi, and a drain electrode connected to the output node N1. An NMOS transistor 10 has a gate electrode connected to the mode setting control signal WCBRSET, a drain electrode connected to the source electrode of the NMOS transistor 8, and a source electrode connected to a ground voltage VSS. An inverter chain consisting of inverters 12 and 14 latches a signal set at the output node N1. An NMOS transistor 20 has a drain electrode connected to the output node N1, a gate electrode connected to the output signal of an inverter 22 receiving the constant source voltage signal $\phi$VCCH, and a source electrode connected to the ground voltage VSS. An inverter chain consisting of inverters 16 and 18 shapes the output signal of the inverter 12 and generates the mode setting signal MDSTi.

The mode setting circuit of FIG. 1B is similar to that of FIG. 1A. A PMOS transistor 24 receiving the constant source voltage signal $\phi$VCCH is connected between the source voltage VCC and the output node N1.

The mode setting circuits of FIGS. 1A and 1B can set a specific mode during the enabled interval of the mode setting control signal WCBRSET. The specific mode can be set at a desired time by the combination of the row address signal RAi generated from the row address buffer.

In FIG. 1A, if the mode setting control signal WCBRSET is enabled to logic "high", the PMOS and NMOS transistors 4 and 10 are turned on, enabling the mode setting circuit. After power-up, the constant source voltage signal $\phi$VCCH of logic "high" is applied to the inverter 22, and the NMOS transistor 20 with the gate electrode connected to the output signal of the inverter 22 is turned off. Therefore, either logic "high" of a source voltage VCC level or logic "low" of a ground voltage VSS level is set at the output node N1 according to the state of the row address signal RAi.

FIG. 2 illustrates a circuit for generating the mode setting control signal WCBRSET shown in FIGS. 1A and 1B. FIG. 3 illustrates an example of operation of FIG. 2.

Referring to FIG. 2, there are supplied control signals $\phi$RD and $\phi$RAR generated in synchronization with an antiphase of the row address strobe signal $\overline{RAS}$, the row address signal RAi generated from the row address buffer, and a meter control signal WCBRB generated by the combination of a column address signal, a row address signal and a write enable signal under the write enable CAS before RAS (WCBR) condition. A NOR gate 28 receives the master control signal WCBRB and the output signal of an inverter 26 receiving the control signal $\phi$RD. An inverter 30 receives the row address signal RAi. An inverter chain consisting of inverters 32, 34, 36 and 38 receives the control signal $\phi$RAR. A NAND gate 40 receives the output signal of the NOR gate 28 and the output signals of the inverters 30 and 38. An inverter 42 receives the output signal of the NAND gate 40 and generates the mode setting control signal WCBRSET. Resistors R1, R2 and capacitors C1, C2 connected to the inverter chain function as time delay elements.

As indicated in FIG. 3, if the control signal $\phi$RD, the master control signal WCBRB, and the control signal $\phi$RAR are respectively enabled to logic "high", logic "low" and logic "high", the mode setting control signal WCBRSET of logic "high" is generated after a given time. The mode setting control signal WCBRSET is supplied to the mode setting circuits of FIGS. 1A and 1B.

FIG. 4 illustrates a circuit for generating the master control signal WCBRB shown in FIG. 2. A first logic circuit 44 receives an internal output signal $\phi$C of a column address strobe signal buffer, an internal output signal $\phi$W of a write enable signal buffer, and an internal output signal $\phi$RP of a row address strobe signal buffer. A NOR gate 54 receives control signals $\phi$RD1 and $\phi$RD2 generated in synchronization with the antiphase of the row address strobe signal $\overline{RAS}$. A second logic circuit 46 receives the output signal of the first logic circuit 44 through a node L1. A PMOS transistor 48 has a source electrode connected to the source voltage VCC, a drain electrode connected to the node L1, and a gate electrode connected to the output signal of an inverter 56 receiving the output signal of the NOR gate 54. An inverter chain consisting of inverters 50 and 52 receives the output signal of the second logic circuit 46 and generates the master control signal WCBRB.

In operation, after the master control signal WCBRB is enabled to logic "low" by the signals φC and φW, it is precharged to logic "high" of the source voltage level by the PMOS transistor 48 controlled by the control signals φRD1 and φRD2. It is desirable to rapidly precharge the master control signal WCBRB for the next operation mode. However, it takes much time to precharge the master control signal WCBRB.

In the conventional mode setting circuits, the mode setting control signal WCBRSET is controlled by the control signals φRD and φRAR synchronized with the antiphase of the row address strobe signal $\overline{RAS}$. Therefore, in order to set another operation mode after setting a specific operation mode, it is necessary to precharge signals associated with the row address strobe signal $\overline{RAS}$, such as the control signals φRD and φRAR. Since it takes at least 30 ns or so to set a specific operation mode, the same time is wasted to convert the operation mode. In a synchronous graphic DRAM (Dynamic Random Access Memory) which operates at a high frequency and frequently varies in the operation mode, the operating speed is thus undesireably lowered, and can result in malfunction.

SUMMARY OF THE INVENTION

It is an object of the invention to provide a mode setting circuit and method of a semiconductor memory device which can minimize a setting time from a prescribed operation mode to the next operation mode.

It is another object of the invention to provide a mode setting circuit and method of a semiconductor memory device which can generate a mode setting signal independent of a row address strobe signal of a master signal of the semiconductor memory device.

It is a further object of the invention to provide a mode setting circuit and method of a semiconductor memory device which is suitable for a high speed operation and prevents loss in speed and malfunction by minimizing a mode setting time.

A mode setting circuit embodying the present invention includes a gating circuit and a latch circuit. The gating circuit gates a signal set at an internal node of a row address buffer according to a mode setting control signal. The row address buffer receives a row address signal supplied externally from the chip and generates a shaped row address. The latch circuit latches a signal generated from the gating circuit and generates a mode setting signal for enabling the specific operation mode in response to a variation in a specific signal of the internal node.

DETAILED DESCRIPTION OF THE PREFERRED EMBODIMENT

Figure 5A:
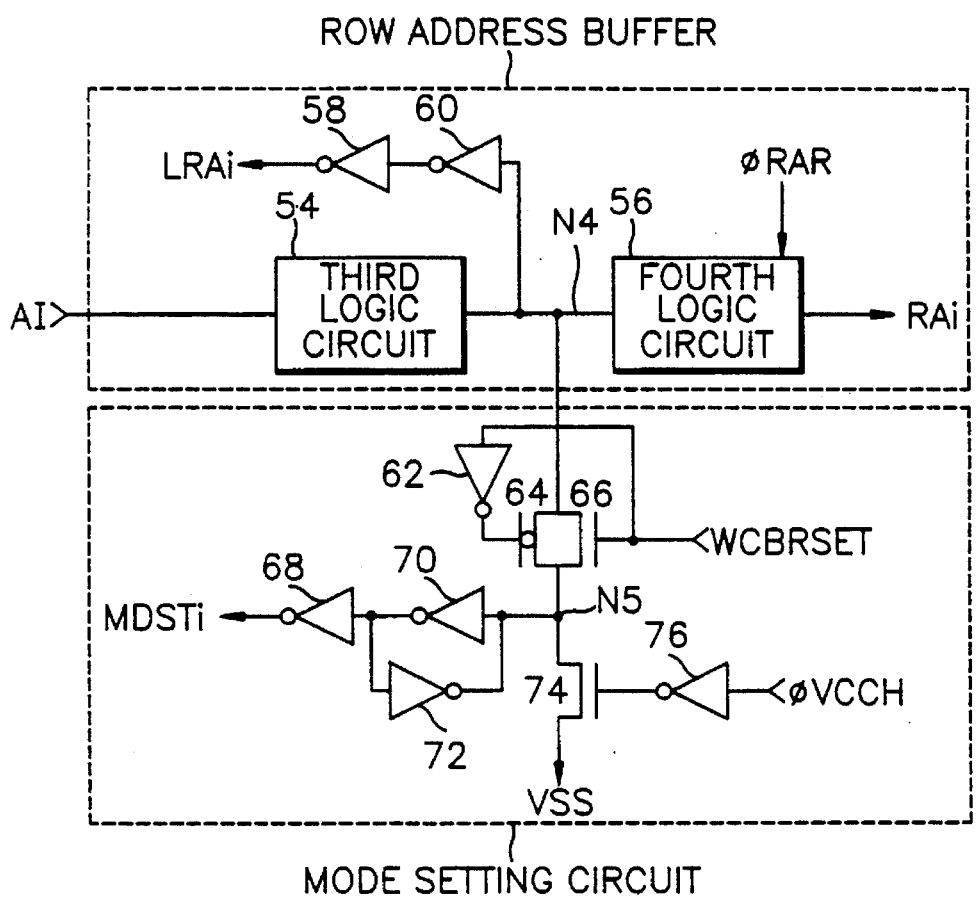
FIGS. 5A and 5B are schematic diagrams of mode setting circuits according to the present invention.

Referring to FIG. 5A, a row address buffer has a third logic circuit 54 for receiving an address input signal AI of a TTL (Transistor-Transistor Logic) level applied from the exterior, an inverter chain consisting of inverters 58 and 60 for receiving the output signal of the third logic circuit 54 and generating an output signal LRAi of a CMOS (Complementary Metal Oxide Semiconductor) level, and a fourth logic circuit 56 for receiving the output signal of the third logic circuit 54 and a control signal φRAR generated in synchronization with an antiphase of a row address strobe signal $\overline{RAS}$ and generating a row address signal RAi. A mode setting circuit receives a signal generated at an internal node N4 of the row address buffer and generates a mode setting signal MDSTi. The row address buffer receives the row address supplied from the exterior and generates the shaped row address RAi.

The mode setting circuit shown in FIG. 5A includes a gating circuit consisting of an NMOS transistor 66 and a PMOS transistor 64 with respective gate electrodes respectively connected to a mode setting control signal WCBRSET and the output signal of an inverter 62 receiving the mode setting control signal WCBRSET. The gating circuit is connected between nodes N4 and N5 and gates the internal node N4 of the row address buffer according to the mode setting control signal WCBRSET. An NMOS transistor 74 is connected between the node N5 and a ground voltage VSS and has a gate electrode connected to the output signal of an inverter 76 receiving a constant source voltage signal φVCCH. An inverter chain consisting of inverters 70 and 72 latches a signal set at the node N5. An inverter 68 receives the output signal of the inverter 70 and generates the mode setting signal MDSTi.

Figure 5B:
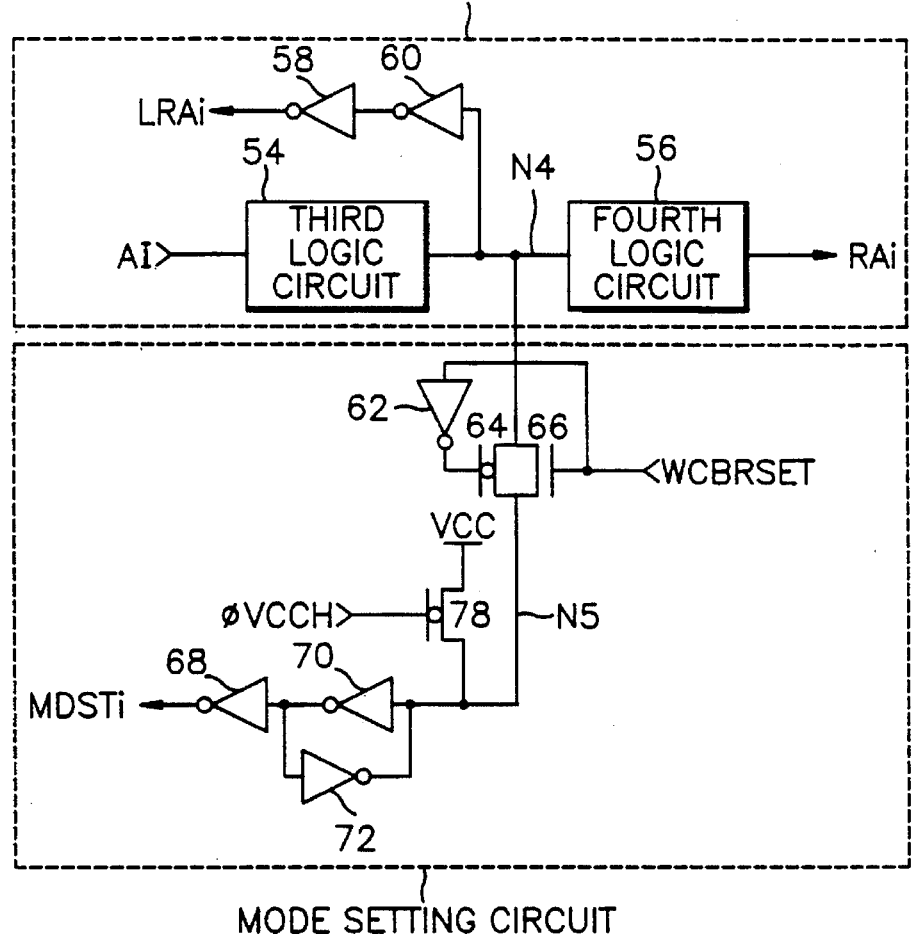

The mode setting circuit of FIG. 5B is similar to that of FIG. 5A. A PMOS transistor 78 for receiving the constant source voltage signal φVCCH is connected to a source voltage VCC and the node N5.

Figure 1A:
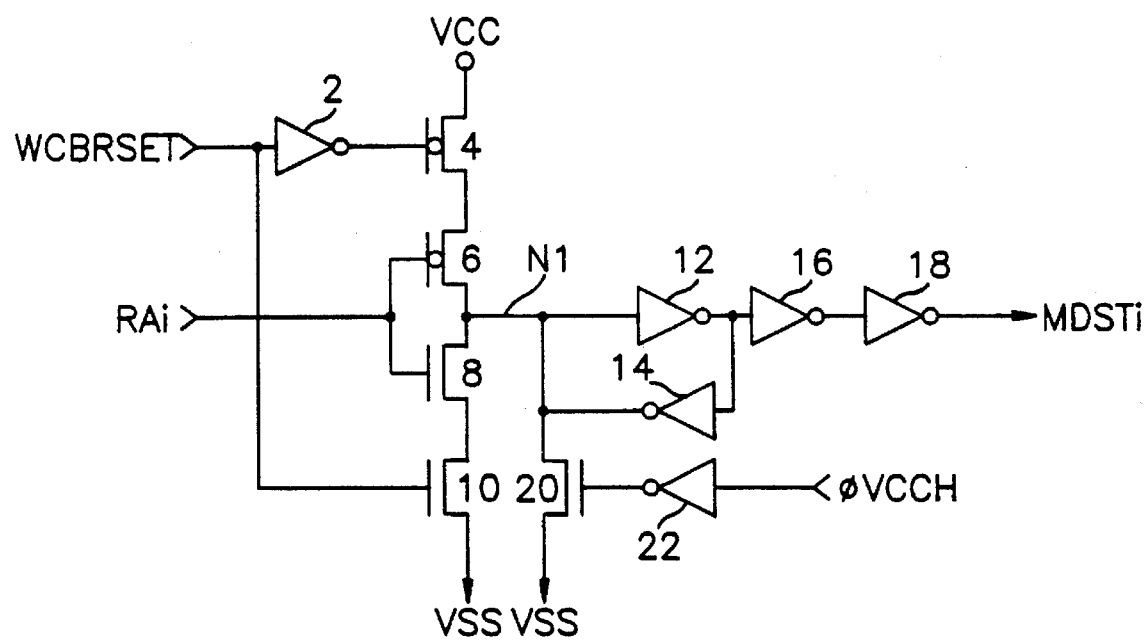
FIGS. 1A and 1B are schematic diagrams of conventional mode setting circuits.
Figure 1B:
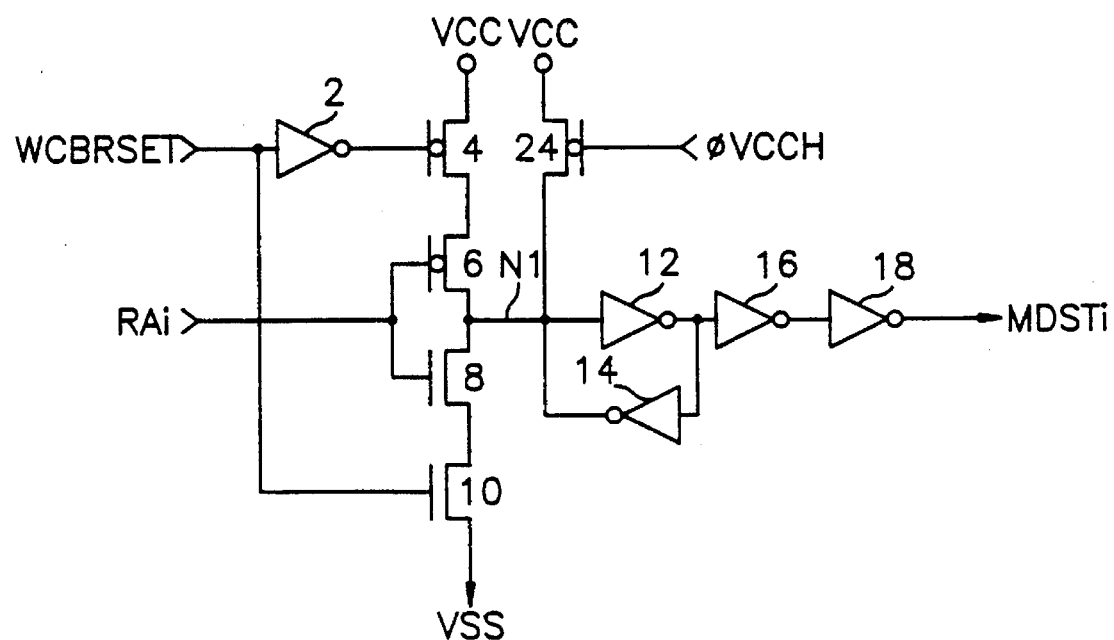
Figure 2:
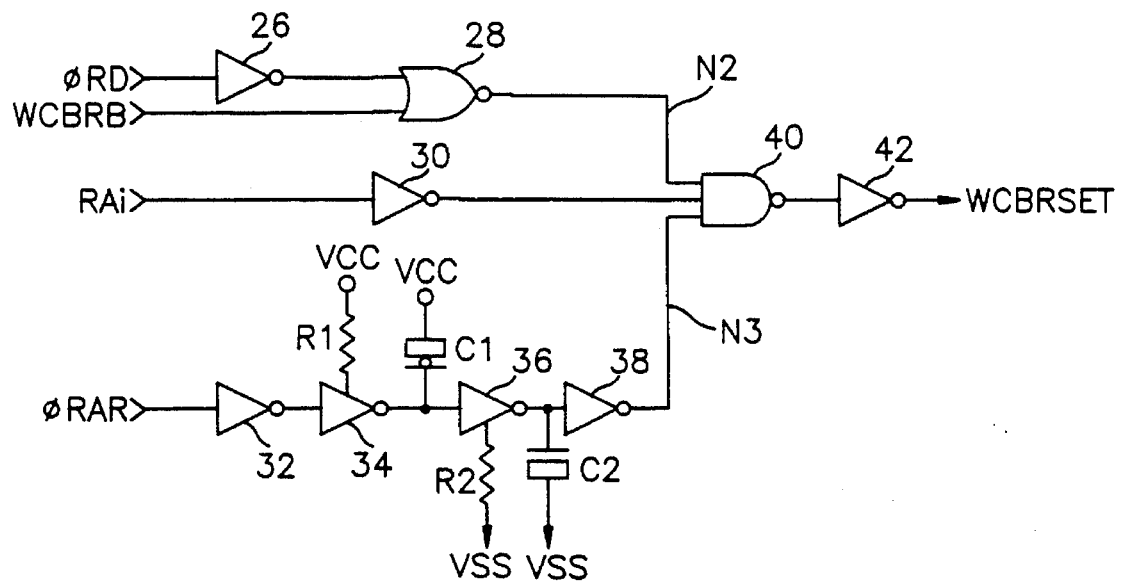
FIG. 2 is a schematic diagram illustrating a circuit for generating a mode setting control signal shown in FIGS. 1A and 1B.
Figure 3:
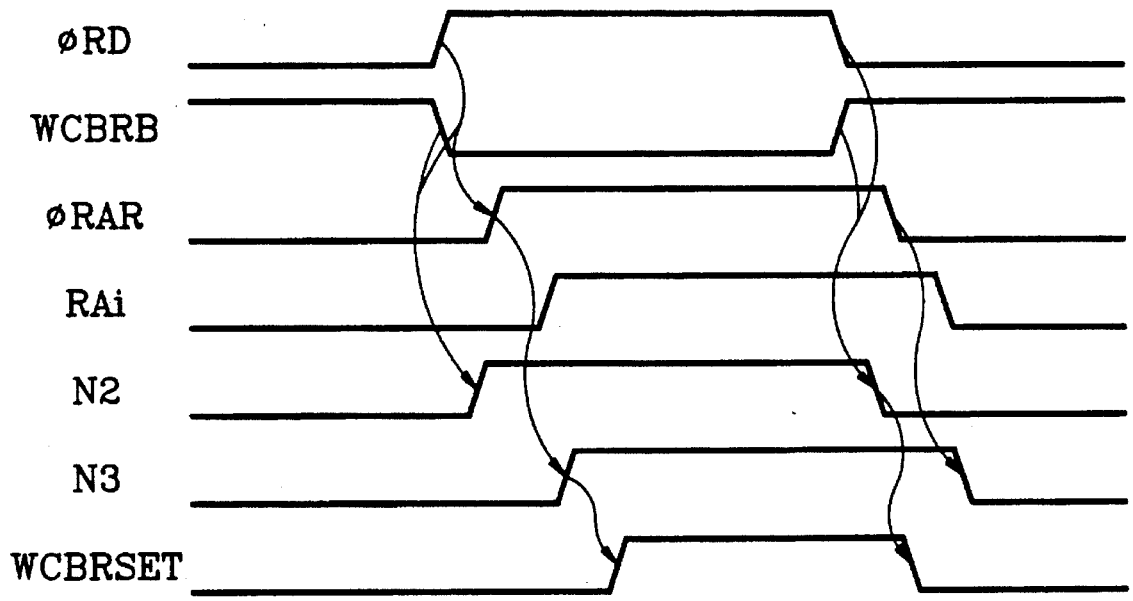
FIG. 3 is a timing chart illustrating an example of operation of FIG. 2.
Figure 4:
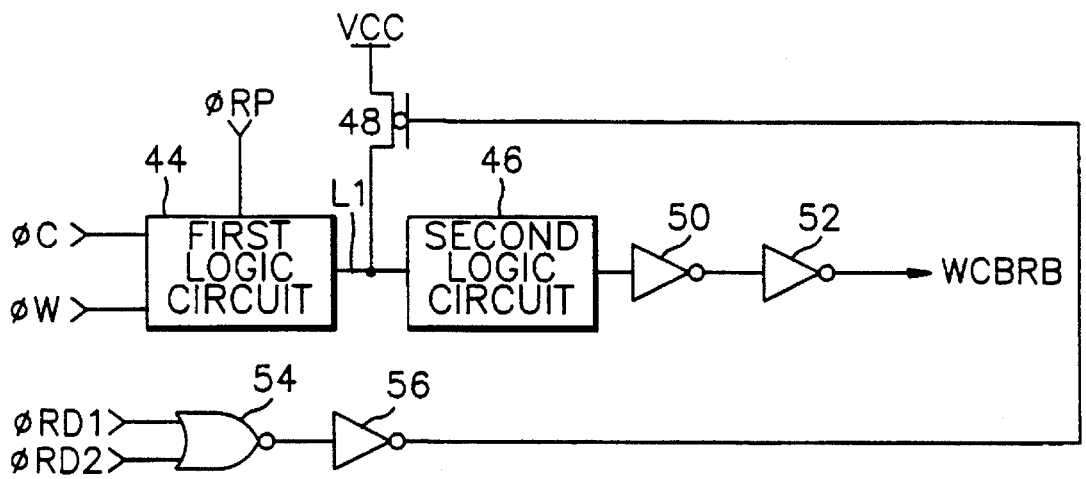
FIG. 4 is a schematic diagram illustrating a circuit for generating a master control signal shown in FIG. 2.

The mode setting circuits shown in FIGS. 5A and 5B receive the signal set at the internal node N4 of the row address buffer and, when the mode setting control signal WCBRSET is enabled, generate the mode setting signal MDSTi by controlling the gating circuit with a signal independent of the control signal φRAR. In the mode setting circuits shown in FIGS. 1A and 1B, the row address signal RAi which is controlled by the control signal φRAR generated in synchronization with the antiphase of the row address strobe signal $\overline{RAS}$ is applied to generate the mode setting signal. However, since the mode setting circuits shown in FIGS. 5A and 5B generate the mode setting signal MDSTi by use of the internal node of the address buffer, the mode setting signal MDSTi is generated irrespective of the enabled time of the control signal φRAR, thereby improving the operating characteristics. That is, in FIGS. 1A and 1B, the signals associated with the row address strobe signal $\overline{RAS}$, such as the control signals φRD and φRAR, require a precharge time to set another operation mode after a specific operation mode is set. In FIGS. 5A and 5B, since an additional precharge time is not required, the high speed operation can be achieved.

Figure 6:
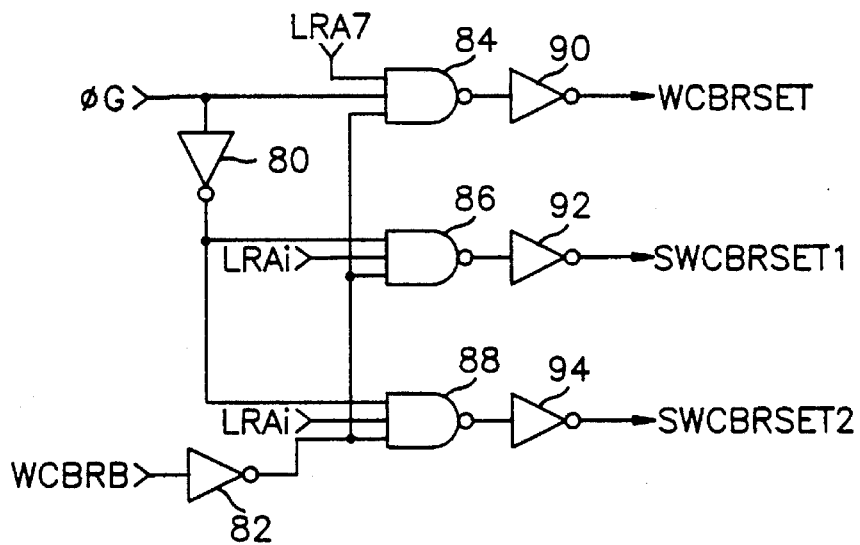
FIG. 6 is a schematic diagram illustrating a circuit for generating a mode setting control signal shown in FIGS. 5A and 5B.
Figure 7:
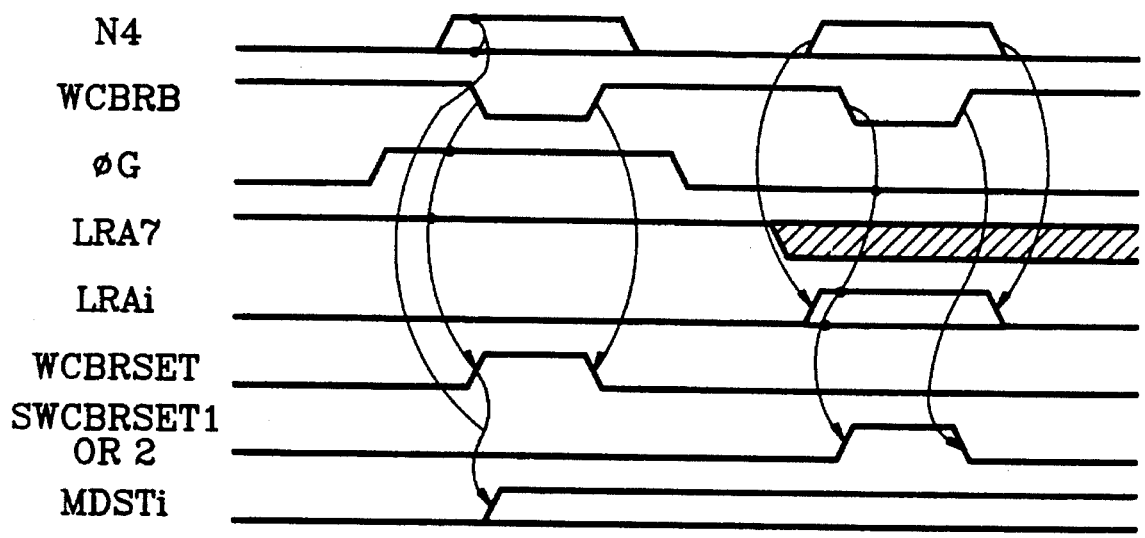
FIG. 7 is a timing diagram illustrating an example of operation of FIGS. 5A, 5B and 6.

FIG. 6 illustrates a circuit for generating the mode setting control signal WCBRSET shown in FIGS. 5A and 5B. FIG. 7 illustrates an example of operation of FIGS. 5A, 5B and 6.

Referring to FIG. 6, a graphic related signal φG and a master control signal WCBRB are supplied to generate the mode setting control signal WCBRSET and a graphic mode setting signal SWCBRSETi. A NAND gate 84 receives the graphic related signal φG, a specific signal LRA7 out of the signal LRAi generated from the internal node of the row address buffer, and the output signal of an inverter 82 receiving the master control signal WCBRB. A NAND gate 86 receives the output signal of an inverter 80 receiving the graphic related signal φG, the signal LRAi generated from the internal node of the row address buffer, and the output signal of the inverter 82 receiving the master control signal WCBRB. A NAND gate 88 receives the output signal of the inverter 80, the signal LRAi generated from the internal node of the row address buffer, and the output signal of the inverter 82. An inverter 90 connected to the output signal of the NAND gate 84 generates the mode setting control signal WCBRSET. An inverter 92 connected to the output signal of the NAND gate 86 generates a first graphic mode setting signal SWCBRSET1. An inverter 94 connected to the output signal of the NAND gate 88 generates a second graphic mode setting signal SWCBRSET2.

As shown in FIG. 7, the master control signal WCBRB is generated as a short pulse of logic "low". The circuit of FIG. 6 selectively enables the graphic mode setting signal SWCBRSETi or the mode setting control signal WCBRSET by use of the signal LRAi generated from the internal node of the row address buffer and the graphic related signal φG. For example, the mode setting control signal WCBRSET is enabled or disabled according as the specific signal LRA7 out of LRAi is enabled or disabled. When the mode setting control signal WCBRSET is enabled, the graphic mode setting signal SWCBRSET1 or SWCBRSET2 is selectively enabled by the graphic related signal φG, the signal LRAi and the master control signal WCBRB.

Figure 8B:
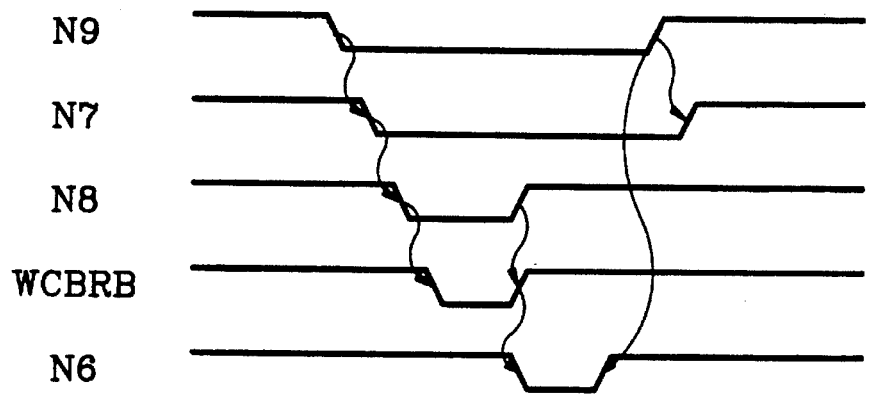
FIG. 8B is a timing chart illustrating an example of operation of FIG. 8A.
Figure 8A:
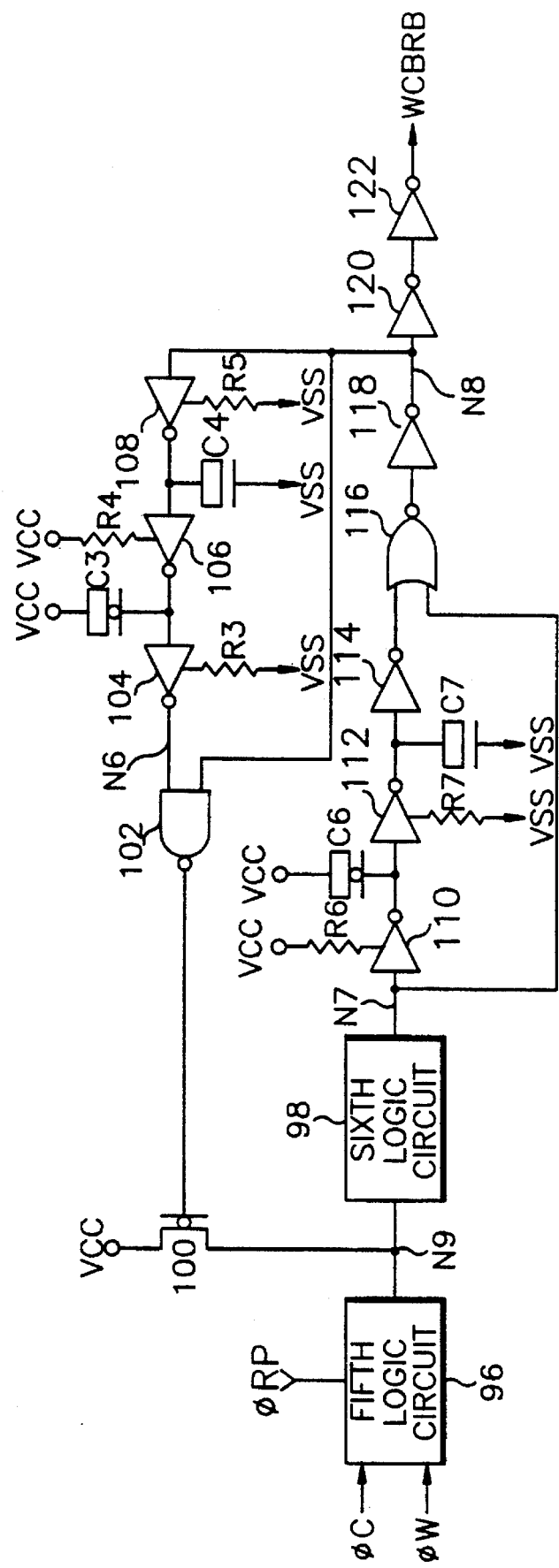
FIG. 8A is a schematic diagram illustrating a circuit for generating a master control signal shown in FIG. 6.

FIG. 8A illustrates a circuit for generating the meter control signal WCBRB shown in FIG. 6. The circuit of FIG. 8A is operated as a short pulse generating circuit which can generate a short pulse through a logic gate and a delay circuit. A fifth logic circuit 96 receives an internal output signal φC of a column address strobe signal buffer (CAS buffer), an internal output signal φW of a write enable signal buffer (WE buffer), and an auto pulse signal φRP automatically generated when the row address strobe signal $\overline{RAS}$ is enabled to logic "low" within a row address strobe signal buffer (RAS buffer). A sixth logic circuit 98 is connected to an output node N9 of the fifth logic circuit 96. A NOR gate 116 receives a signal set at an output node N7 of the sixth logic circuit 98 and a signal generated through an inverter chain consisting of inverters 110, 112 and 114. An inverter 118 receives the output signal of the NOR gate 116. An inverter chain consisting of inverters 120 and 122 receives the output signal of the inverter 118 and generates the master control signal WCBRB. A NAND gate 102 receives the output signal of the inverter 118 and an output signal generated through inverters 108, 106 and 104. A PMOS transistor 100 has a source electrode connected to the source voltage VCC, a drain electrode connected to the node N9, and a gate electrode connected to the output signal of the NAND gate 102. Resistors R6, R7, capacitors C6, C7, resistors R4, R5, and capacitors C3, C4 connected to the inverter chains are operated as time delay elements.

Referring to FIG. 8B, the master control signal WCBRB is generated as a short pulse in response to an auto pulse set at the node N8. Through such an operation, the master control signal WCBRB is automatically precharged to logic "high". Thereafter, the node N8 is also automatically precharged by the auto pulse to perform the next operation.

Figure 9A:
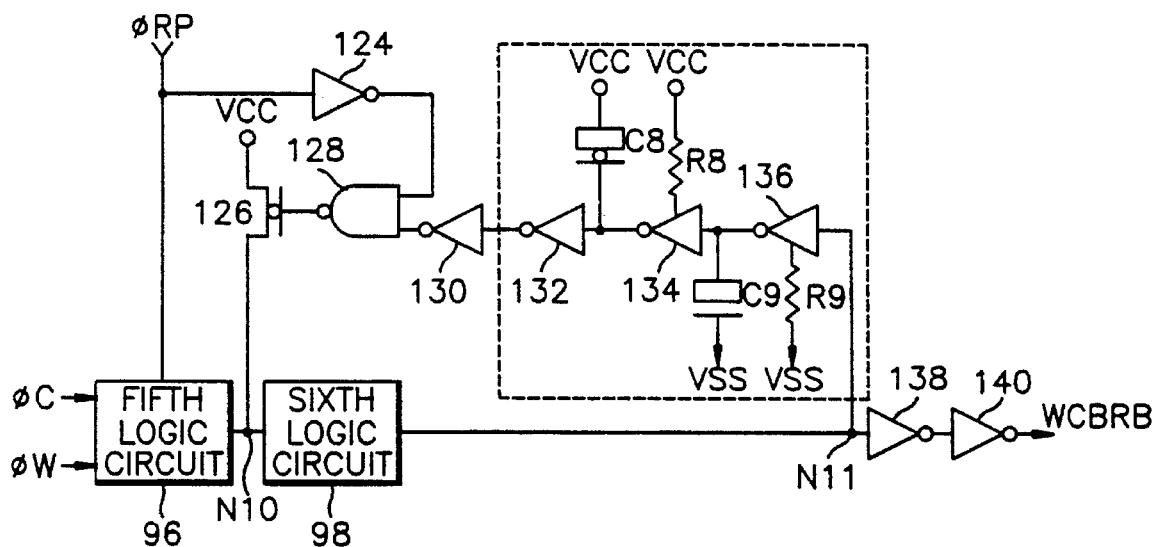
FIG. 9A is a schematic diagram illustrating another circuit for generating a master control signal shown in FIG. 6.

FIG. 9A illustrates another circuit for generating the master control signal WCBRB. An inverter chain connected between a node N11 receiving the output signal of the sixth logic circuit 98 and an inverter 130 may be selectively used.

Figure 9B:
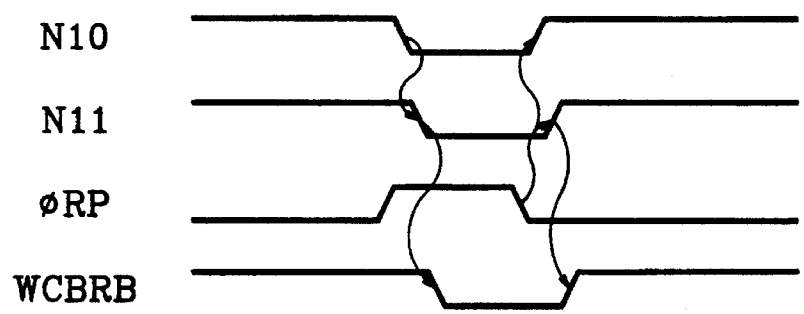
FIG. 9B is a timing chart illustrating an example of operation of FIG. 9A.

As shown in FIG. 9B, the master control signal WCBRB is also generated as the short pulse. The circuit of FIG. 9A drives a PMOS transistor 126 by detecting the auto pulse φRP generated within the row address strobe signal buffer or a logic "low" state of the master control signal WCBRB generated from the sixth logic circuit 98. Therefore, the meter control signal WCBRB generated from the sixth logic circuit 98 is precharged to logic "high" and the enabled interval of the master control signal WCBRB has a very short period.

In the conventional master control signal generating circuit, the master control signal WCBRB is disabled by the antiphase signal of the row address strobe signal $\overline{RAS}$. In the inventive mater control signal generating circuits, the master control signal WCBRB is generated as the short pulse to greatly reduce the mode setting time.

While preferred embodiments of the present invention have been particularly shown and described, it will be understood by those skilled in the art that foregoing and other changes in form and details may be made without departing from the spirit and scope of the present invention as defined in the appended claims. For example, it may be possible to replace the graphic mode using the graphic related signal φG with other modes. Furthermore, in the master control signal generating circuits, signal delay may be controlled by adjusting the number of inverters within the inverter chain and the number of capacitors.

As described above, when setting a specific operation mode out of preset operation modes, the setting time to another operation mode from a given operation mode can be minimized. The mode setting signal which is independent of the row address strobe signal of the master signal of the semiconductor memory device can be generated. The inventive mode setting circuit is suitable for a high speed operation and prevents loss in speed and malfunction by minimizing the mode setting time.

What is claimed is:

1. A mode setting circuit of a semiconductor memory device for selectively enabling a specific operation mode out of preset operation modes, comprising:

gating means for gating a signal set at an internal node of a row address buffer according to a mode setting control signal, said row address buffer receiving a row address signal supplied externally to obtain said signal and generating therefrom a shaped row address signal; and latch means for latching a mode signal generated from said gating means that corresponds to said signal of said internal node, and generating therefrom a mode setting signal for enabling said specific operation mode so that variation in said signal of said internal node causes variation in said specific operation mode.

2. The mode setting circuit as set forth in claim 1, wherein said mode setting control signal is generated in response to a master control signal generated as a short pulse to reduce a mode setting time.

3. The mode setting circuit as set forth in claim 2, wherein said master control signal is independent of a row address strobe signal.

4. The mode setting circuit as set forth in claim 1, wherein said gating means comprises an NMOS transistor and a PMOS transistor having respective channels commonly connected to each other and having respective gate electrodes respectively connected to said mode setting control signal and an inverted mode setting control signal.

5. The mode setting circuit as set forth in claim 1, wherein said latch means comprises latch-connected inverters.

6. A mode setting method of a semiconductor memory device for selectively enabling a specific operation mode out of preset operation modes, comprising the steps of:

gating a signal set at an internal node of a row address buffer according to a mode setting control signal, said row address buffer receiving a row address signal supplied externally to obtain said signal and generating therefrom a shaped row address signal; and latching a mode signal generated from said gating step that corresponds to said signal set at said internal node and generating therefrom a mode setting signal for enabling said specific operation mode so that variation in said signal of the said internal node causes variation in said specific operation mode.

7. The mode setting method as set forth in claim 6, wherein said mode setting control signal is generated in response to a master control signal generated as a short pulse to reduce a mode setting time.

8. The mode setting circuit as set forth in claim 7, wherein said master control signal is independent of a row address strobe signal.

9. A semiconductor memory device for selectively enabling a specific operation mode out of preset operation modes, comprising:

a mode setting signal generating circuit having gating means for gating a signal set at an internal node of a row address buffer according to a mode setting control signal, and having latch means for latching a mode signal generated from said gating means that corresponds to said signal of said internal node and generating therefrom a mode setting signal, said row address buffer receiving a row address signal supplied externally to obtain said signal and generating therefrom a shaped row address signal;

a master control signal generating circuit for combining an internal output signal of a column address strobe signal buffer, an internal output signal of a write enable signal buffer, and an internal output signal of a row address strobe signal buffer and generating a master control signal of a short pulse through delay means; and a mode setting control signal generating circuit for receiving said master control signal and said signal set at said internal node and generating said mode setting control signal so that variation in said signal of said internal node causes variation in said specific operation mode.

10. The semiconductor memory device as set forth in claim 9, wherein said master control signal is independent of a row address strobe signal.

* * * * *